US012690444B2

(12) United States Patent
Engel et al.

(10) Patent No.: US 12,690,444 B2
(45) Date of Patent: Jul. 21, 2026

(54) INLINE CIRCUIT EDIT FOR BACKSIDE POWER DELIVERY

(71) Applicant: Intel Corporation, Santa Clara, CA (US)

(72) Inventors: Clifford J. Engel, Hillsboro, OR (US); Robert L. Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 17/743,933

(22) Filed: May 13, 2022

(65) Prior Publication Data

US 2023/0369222 A1     Nov. 16, 2023

(51) Int. Cl.
| | |
|---|---|
| *H01L 23/528* | (2006.01) |
| *H01L 21/8234* | (2006.01) |
| *H01L 27/088* | (2006.01) |
| *H01L 29/06* | (2006.01) |
| *H01L 29/417* | (2006.01) |
| *H01L 29/423* | (2006.01) |
| *H01L 29/66* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |

(Continued)

(52) U.S. Cl.
CPC ........ *H10W 20/427* (2026.01); *H10D 30/014* (2025.01); *H10D 30/031* (2025.01); *H10D 30/43* (2025.01); *H10D 30/6729* (2025.01);

*H10D 30/6735* (2025.01); *H10D 30/6757* (2025.01); *H10D 62/121* (2025.01); *H10D 84/0149* (2025.01); *H10D 84/038* (2025.01); *H10D 84/83* (2025.01)

(58) Field of Classification Search
CPC .. H10D 30/014; H10D 30/024; H10D 30/031; H10D 30/43; H10D 30/62; H10D 30/6211; H10D 30/6212; H10D 30/6213; H10D 30/6729; H10D 30/6735; H10D 30/6757; H10D 62/118; H10D 62/119; H10D 62/121; H10D 84/0158; H10D 84/0149; H10D 84/0193; H10D 84/038; H10D 84/83; H10D 84/834; H10D 84/853; H01L 23/528; H01L 23/5286
See application file for complete search history.

(56) References Cited

U.S. PATENT DOCUMENTS

2022/0181258 A1* 6/2022 Liebmann .............. H10D 30/67
2023/0343838 A1* 10/2023 Chang .................. H10D 62/121

* cited by examiner

*Primary Examiner* — David C Spalla
(74) *Attorney, Agent, or Firm* — Schwabe, Williamson & Wyatt, P.C.

(57) ABSTRACT

Lithographic methodologies involving, and apparatuses suitable for, inline circuit edits are described. In an example, an integrated circuit structure includes a device layer including a plurality of transistor structures. A front-end routing layer is above the device layer, the front-end routing layer coupled to one or more of the plurality of transistors. A backside metal structure is below the device layer. A conductive feedthrough structure is directly coupling the backside metal structure to the front-end routing layer. The conductive feedthrough structure is a monolithic structure extending through the device layer.

17 Claims, 14 Drawing Sheets

(51) Int. Cl.
    *H10D 84/03*          (2025.01)
    *H10D 84/83*          (2025.01)
    *H10W 20/41*          (2026.01)

PLAN VIEW 900

902

904

CROSS-SECTIONAL VIEW

902'        902

904

1400

INLINE CIRCUIT EDIT FOR BACKSIDE POWER DELIVERY

TECHNICAL FIELD

Embodiments of the disclosure are in the field of lithography and, in particular, lithography involving inline circuit edits using e-beam lithography.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

However, improvements are needed in the area of lithographic processing technologies and capabilities.

DESCRIPTION OF THE EMBODIMENTS

Figures 1A, 1B:
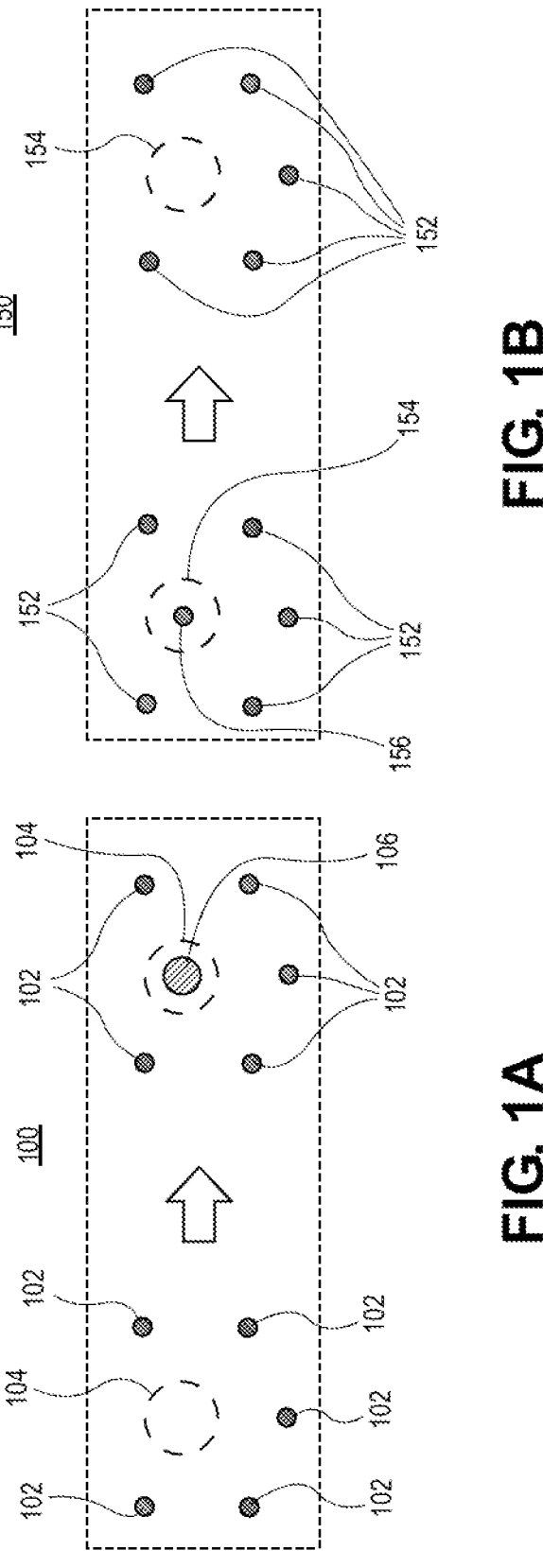
FIGS. 1A and 1B illustrate schematic representations of an inline circuit edit approach wherein a feature is added (FIG. 1A) or where a feature is removed (FIG. 1B), in accordance with an embodiment of the present disclosure.

Lithographic methodologies involving, and apparatuses suitable for, inline circuit edits are described. In the following description, numerous specific details are set forth, such as specific integration, tooling, and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to inline circuit editing using maskless lithography. One or more embodiments described herein are directed to designs to enable inline circuit edit with backside power delivery via transistor access points. One or more embodiments are directed to approaches for performing an inline circuit edit from a backside, connecting to the transistors by creating access points not previously present.

To provide context, inline circuit editing provides an approach as an alternative to requiring fabrication of a new lithographic mask when an edit in the circuit design is desired or needed. Implementation of an inline circuit edit approach can save several weeks off each cycle of logic/debug loop.

In previous approaches, tape out and fabrication of a new mask had to be implemented for each edit iteration. Such an approach can be slow, extending production time by weeks to months. Also, the same pattern is used on every field, whereas with maskless lithography, changes (e.g., design of experiment (DOE) variations) can be made across the wafer and across the field.

In accordance with one or more embodiments of the present disclosure, inline (in-fab) edit of circuit design with e-beam lithography is described. In one embodiment, 300 mm maskless e-beam lithography is used to edit existing mask-based pattern in-line, i.e., without interrupting production flow. Applications can include debug, logic edit, defect metrology, etc. In one embodiment, within a normal wafer processing loop (i.e., inline in the fab), an existing pattern is edited with a maskless lithography tool. In one embodiment, an electron-beam lithography tool is used, but it is to be appreciated that other types of beams could be used as well (e.g., ion, focused photon, etc.) or tools with many multiplexed such beams. In an embodiment, inline circuit edit (ICE) is used for connecting to transistors by creating access points not previously present.

As a general description of concepts described herein, FIGS. 1A and 1B illustrate schematic representations of an inline circuit edit approach wherein a feature is added (FIG. 1A) or where a feature is removed (FIG. 1B), in accordance with an embodiment of the present disclosure.

Referring to FIG. 1A, a schematic for adding features 100 involves an initial (left) pattern having a plurality of features 102, such as via locations. A region 104 indicates a location where an additional feature is needed or desired. By using inline circuit edit for addition of a feature, such as an additional via, an additional feature 106 can be included in the final (right) pattern, e.g., without the need for a new lithographic mask. In another embodiment, an additional portion or portions can be added to an existing feature.

Referring to FIG. 1B, a schematic for removing features 150 involves an initial (left) pattern having a plurality of features 152, such as via locations. A region 154 indicates a location where a feature 156 is needed to be removed or is desired to be removed. By using inline circuit edit for removal of a feature, such as an unwanted or undesired via, feature 156 can be excluded from the final (right) pattern, e.g., without the need for a new lithographic mask. In one such embodiment, removal of the unwanted feature 156 is achieved using formation of a resist plug with an inline circuit edit approach.

Advantages of implementing embodiments described herein can involve reducing time to critical data by weeks versus conventional new mask fabrication. Information turns can be speeded up for logic repair/debug (days versus weeks for new a mask). The turnaround time for prototyping and fixing design errors can be greatly reduced. Furthermore, several solutions can be tried in parallel on one wafer, increasing data turns. Embodiments described herein can be applicable for products for debug and logic edits. Approaches described herein can be applicable to custom and/or low-volume products, such as for foundry based products.

In accordance with one or more embodiments of the present disclosure, designs are described to enable circuit edit signals to route to backside without a need for dedicated whitespace. Embodiments can be implemented using a custom backside e-beam direct write (DW) layer which accesses a backside contact filler structure for re-routing of front-end/back-end devices after front-end processing has been completed. Implementation of embodiments described herein may be detectable by the realization of a metal feedthrough in a filler region. In one embodiment, existing non-active (dummy) transistors are effectively removed, and a new point to access the front-end (above transistor) wiring is created. Additional trenches are etched in the layer below, using an additional pass of e-beam lithography followed by etch. A similar flow is then used to create additional vias connect the metal above to such lines.

Figure 2A:
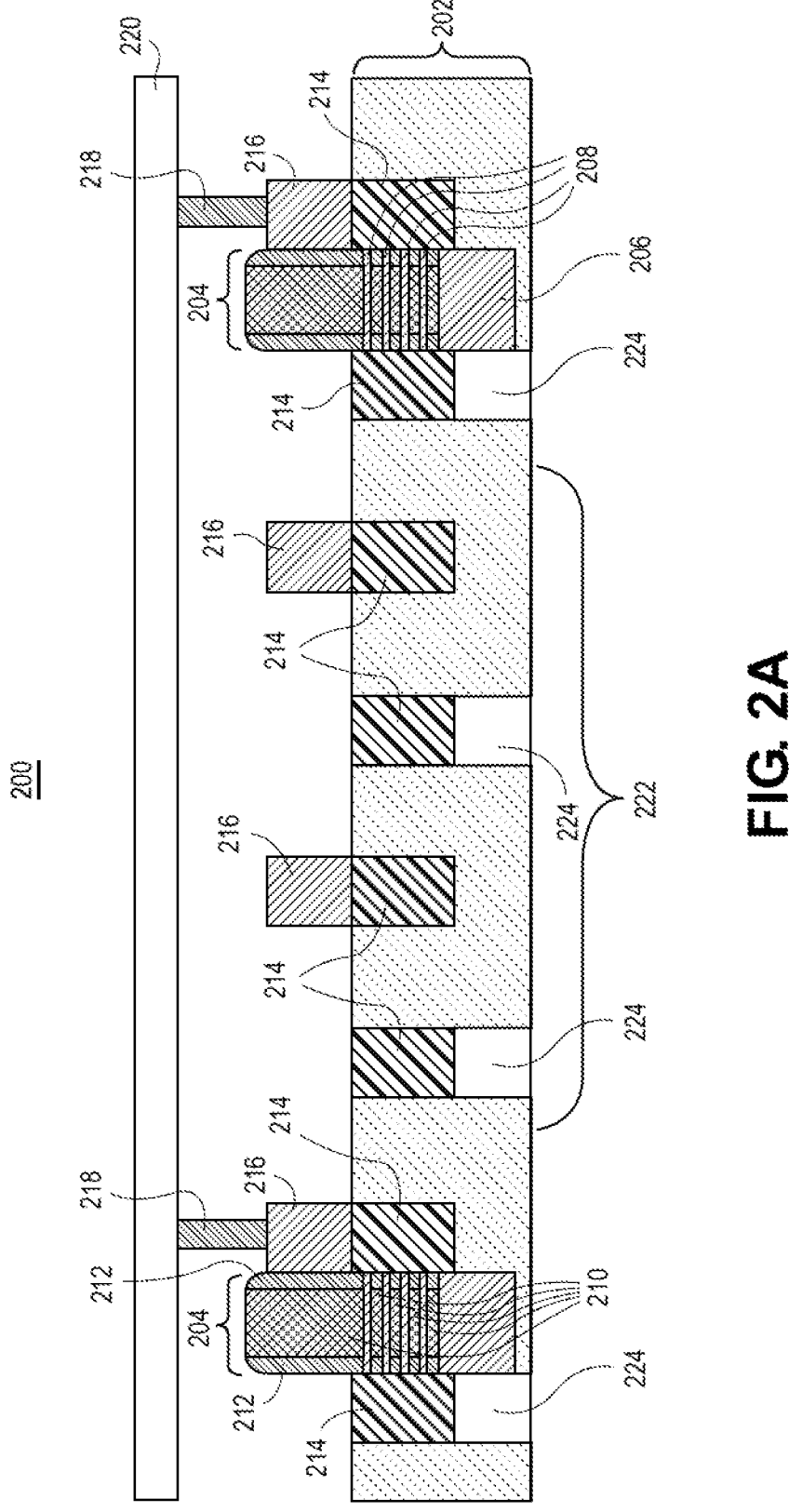
FIGS. 2A, 2B and 3 illustrate cross-sectional views representing various operations in a method of fabricating an integrated circuit structure including routing of backside power delivery formed using maskless lithography, in accordance with an embodiment of the present disclosure.
Figure 2B:
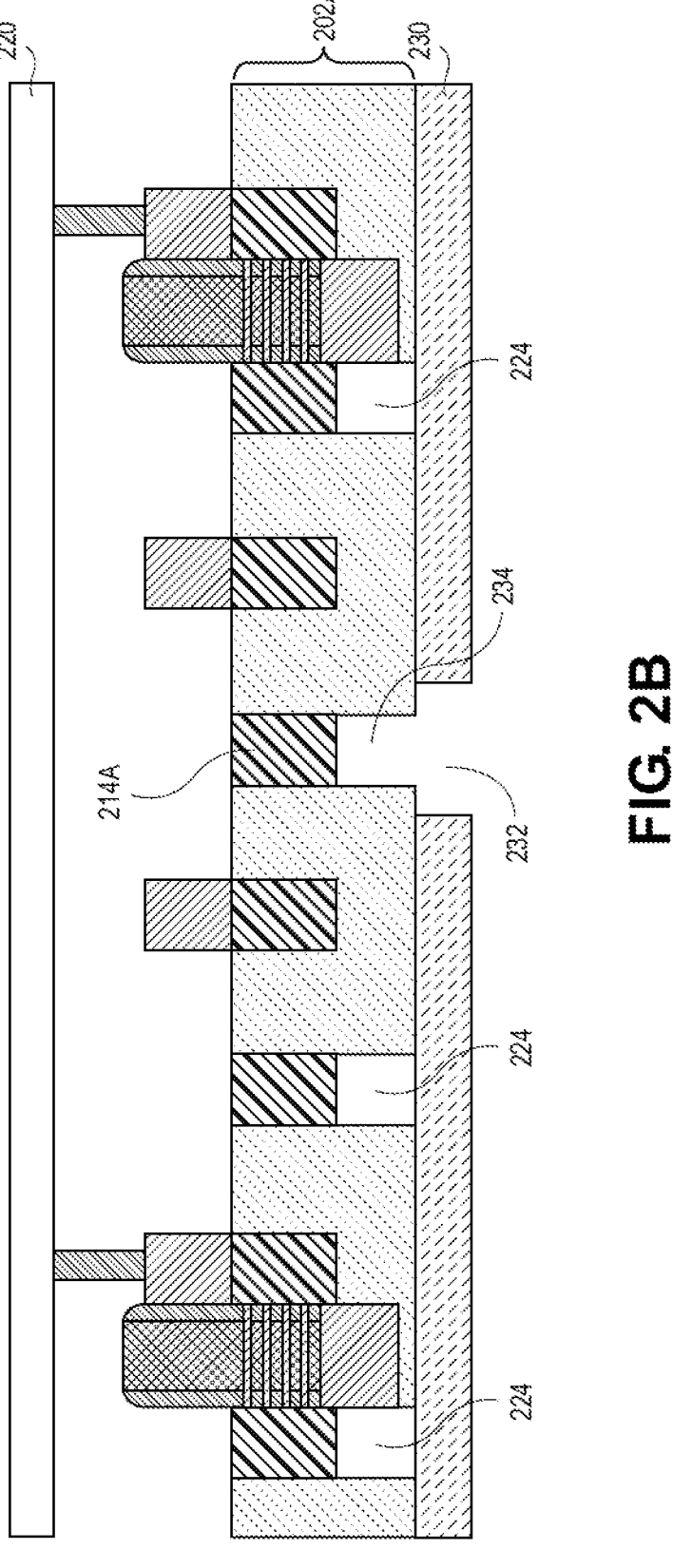
Figure 3:
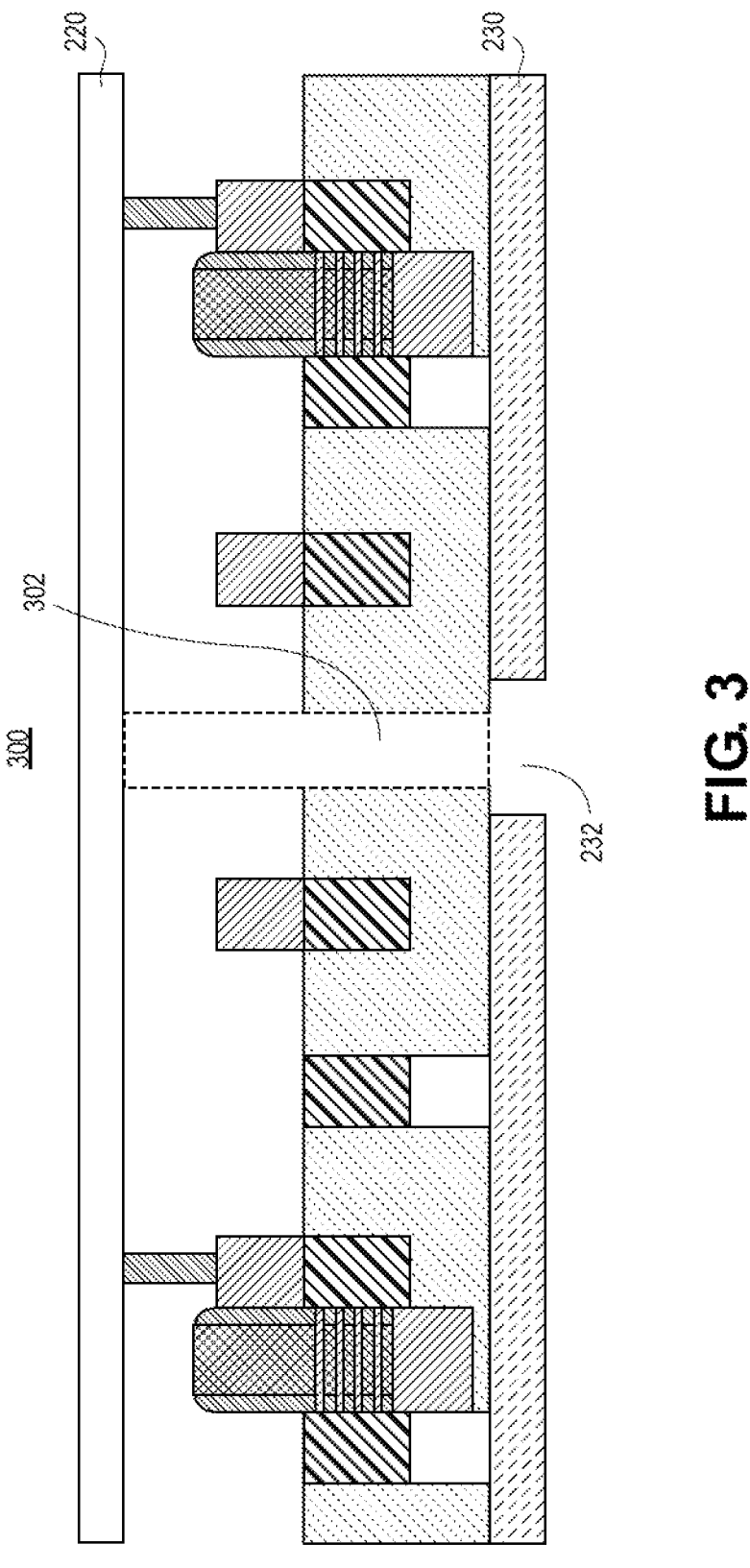
Figure 4:
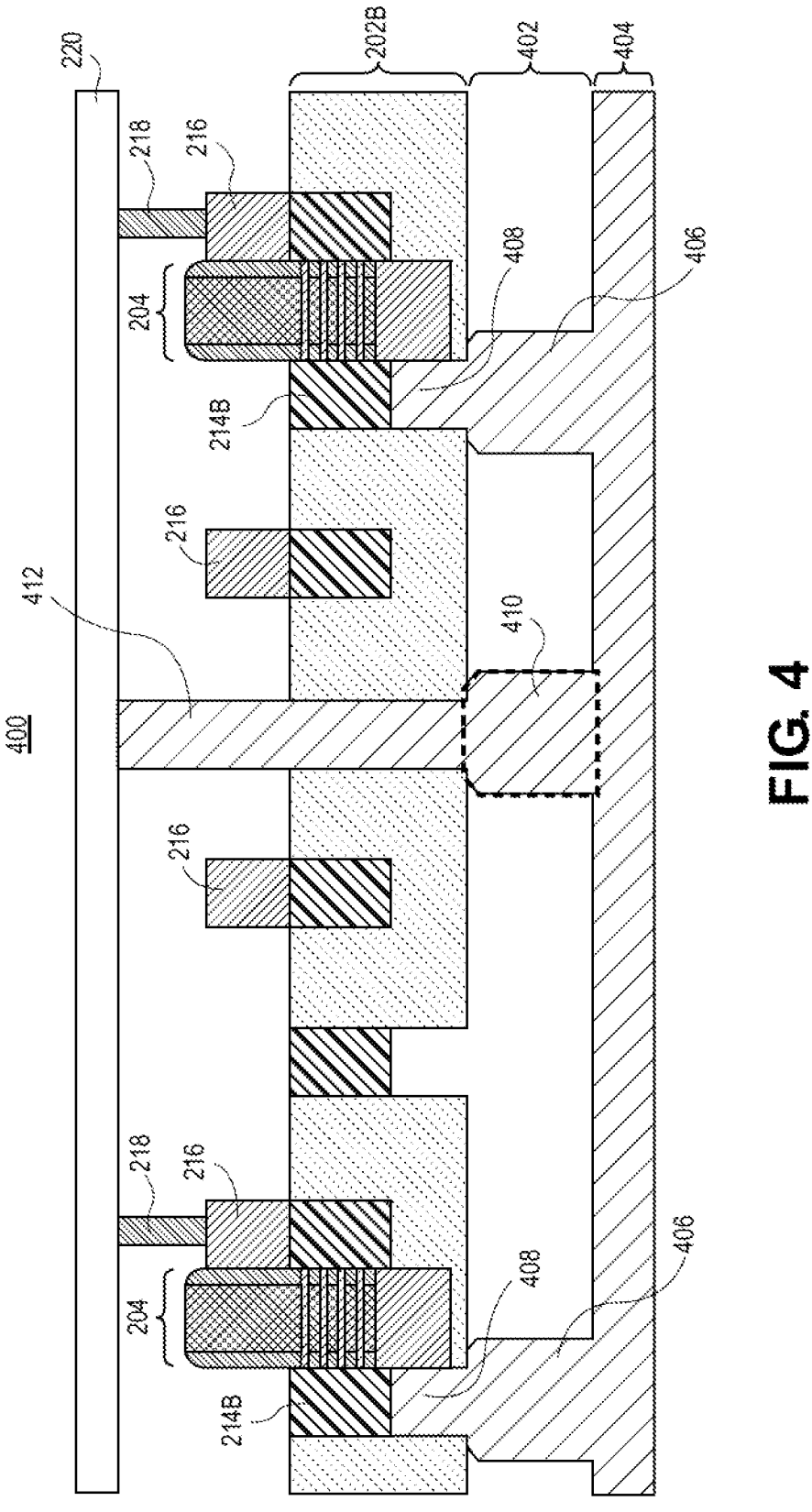
FIG. 4 illustrates a cross-sectional view representing an integrated circuit structure including routing of backside power delivery formed using maskless lithography, in accordance with an embodiment of the present disclosure.

As exemplary processing operations and a resulting structure, FIGS. 2A, 2B and 3 illustrate cross-sectional views representing various operations in a method of fabricating an integrated circuit structure including routing of backside power delivery formed using maskless lithography, in accordance with an embodiment of the present disclosure. FIG. 4 illustrates a cross-sectional view representing an integrated circuit structure including routing of backside power delivery formed using maskless lithography, in accordance with an embodiment of the present disclosure.

Referring to FIG. 2A, a starting structure 200 includes a device layer 202, which may be formed on or above a substrate (not shown) such as a silicon substrate. Device layer 202 includes transistors 204 therein or thereon. In the particular embodiment depicted, each transistor 204 includes a vertical stack of horizontal nanowires 208 over a sub-fin 206, such as silicon nanowires over a silicon sub-fin. A gate structure 210, such as a structure including a get electrode and gate dielectric, is over each vertical stack of horizontal nanowires 208 and is around a channel region of each nanowire of the vertical stack of horizontal nanowires 208. Dielectric gate spacers 212 may be included along sides of the gate structure 210, as is depicted. Each transistor 204 includes associated source or drain structures 214, such as epitaxial source or drain structures, with a pair shown for each transistor 204. Additional such source or drain structures 214 can be included in a non-active region 222 of the device layer 202, as is depicted. Such additional source or drain structures 214 may not be associated with a transistor, as is depicted.

Referring again to FIG. 2A, a backside access structure 224 can be associated with some of the source or drain structures 214, such as every other source or drain structure 214 in device layer 202, as is depicted. Such a backside access structure 224 can be a location selectable for backside contact location, if accessed. In one embodiment, the backside access structures 224 are composed of titanium nitride. A conductive contact structure 216 can be associated with some of the source or drain structures 214, such as the source or drain structures 214 not associated with a backside access structure 224, as is depicted. Some of the conductive contact structures 216 can be associated with a transistor 204, such as the furthest left-hand and furthest right-hand conductive contact structures 216. Additional conductive contact structures 216 can be included in the non-active region 222 of the device layer 202, as is depicted. In an embodiment, the conductive contact structures 216 associated with a transistor 204 are coupled to a front-end routing layer 220, e.g., by conductive vias 218, as is depicted. It is to be appreciated that a dielectric layer or stack of dielectric layers can be included between the front-end routing layer 220 and the device layer 202.

Referring to FIG. 2B, in the case that device layer 204 is formed on a substrate, such as a silicon substrate, the substrate is removed from the backside to expose the backside access structures 224 of thinned device layer 202A. A resist 230 is from on the backside of the resulting structure. An opening 232 is formed in the resist 230 using a maskless lithography process, such as a maskless e-beam process. In the embodiments depicted, the opening exposes one of the backside access structures 224 of the non-active region 222 of the device layer 202A. The backside access structure 224 is removed from that location, to form a trench 234 exposing a select one 214A of the source or drain structures 214 in the non-active region 222.

Referring to FIG. 3, an etch process is used to extend the trench 234 of FIG. 2B to form an extended trench 302 exposed by opening 232. The etch process can involve removal of the source or drain structure 214A, as is depicted. A resulting structure 300 can include the extended trench 302, which accesses the front-end routing layer 220, as is depicted.

Referring to FIG. 4, further processing of the structure 300 of FIG. 3 can provide an integrated circuit structure 400. In the embodiment shown, a conventional lithography process (such as a masked extreme ultraviolet (EUV) lithography process process) is used to expose the backside access structures 224 associated with the transistors 204. The backside access structures 224 are removed in those locations, exposing select source or drain structures 214B. In an embodiment, the conventional lithography is performed in the same resist 230 used for the maskless e-beam process. In another embodiment, the conventional lithography is performed in a different resist than resist 230 used for the maskless e-beam process. The structure is then subjected to a backside metallization process.

Referring again to FIG. 4, structure 400 includes a layer 402 of backside metal structures 406 and 410, e.g., in a dielectric layer (not depicted). The backside metal structures 406 are coupled to a corresponding backside contact 408 of a corresponding transistor 204. The backside metal structure 410 is coupled to a conductive feedthrough structure 412 which is coupled to the front-end routing layer 220. The conductive feedthrough structure 412 can effectively route power from the backside to the front-end routing layer 220 through a device layer 202B. A backside routing layer 404 may then be formed and may couple one or more of the backside metal structures 406 and 410. By using the maskless inline circuit edit patterning operations of FIG. 2, the result is effectively a routing of power delivery without having to use additional or different lithographic masks than were originally designed to fabricate the structure.

With reference again to FIGS. 2A, 2B, 3 and 4, in accordance with an embodiment of the present disclosure, an integrated circuit structure 400 includes a device layer 202B including a plurality of transistor structures 204. A front-end routing layer 220 is above the device layer 202B, the front-end routing layer 220 coupled to one or more of the plurality of transistors 204. A backside metal structure 410 is below the device layer 202B. A conductive feedthrough structure 412 is directly coupling the backside metal structure 410 to the front-end routing layer 220. In one embodiment, the conductive feedthrough structure 412 is a monolithic structure extending through the device layer 202B, as is depicted.

In an embodiment, the conductive feedthrough structure 412 delivers power from the backside metal structure 410 to the front-end routing layer 220. In an embodiment, the conductive feedthrough structure 412 is fabricated by an inline circuit edit process.

In an embodiment, the integrated circuit structure 400 further includes a second backside metal structure 406 coupled to one of the plurality of transistors 204 by a backside contact structure 408. The second backside metal structure 406 is laterally adjacent to the backside metal structure 410. In an embodiment, the integrated circuit structure 400 further includes a backside routing layer 404 below the backside metal structure 410. In an embodiment, individual ones of the plurality of transistors 204 include a plurality of nanowires 208.

With reference again to FIGS. 2A, 2B, 3 and 4, in accordance with an embodiment of the present disclosure, a method of fabricating an integrated circuit structure 400 includes forming a device layer 202B including a plurality of transistor structures 204. The method also includes forming a front-end routing layer 220 above the device layer 202B, the front-end routing layer 220 coupled to one or more of the plurality of transistors 204. The method also includes forming a conductive feedthrough structure 412 using a maskless lithography process, the conductive feedthrough structure 412 coupled to the front-end routing layer 220. The method also includes forming a backside contact structure 408 using a masked lithography process, the backside contact structure 408 coupled to one of the plurality of transistors 204.

In an embodiment, the method further includes forming a first backside metal structure 410 below the device layer 202B, where the conductive feedthrough structure 412 directly couples the first backside metal structure 410 to the front-end routing layer 220. A second backside metal structure 406 is formed below the device layer 202B and is laterally spaced apart from the first backside metal structure 410. The second backside metal structure 406 is coupled to the backside contact structure 408.

In an embodiment, the maskless lithography process is an e-beam process. In an embodiment, the masked lithography process is an extreme ultraviolet (EUV) process.

It is to be appreciated that an inline edit approach as described herein can be considered as a complementary lithography approach. Complementary lithography draws on the strengths of two lithography technologies, working hand-in-hand, to lower the cost of patterning critical layers in logic devices at 20 nm half-pitch and below, in high-volume manufacturing (HVM). The most cost-effective way to implement complementary lithography is to combine optical lithography with e-beam lithography (EBL). In an embodiment, the process of transferring integrated circuit (IC) designs to the wafer entails the following: optical lithography to print a predefined circuit pattern, and EBL to edit the pattern by either adding features, removing features, or both. When used to complement optical lithography, EBL can be referred to as CEBL, or complementary EBL. By not attempting to pattern all layers, CEBL plays a complementary but crucial role in meeting the industry's patterning needs at advanced (smaller) technology nodes and/or in reducing turn-around time by avoiding a mask change for a desired pattern change.

In any case, in an embodiment, complementary lithography as described herein involves first fabricating a circuit pattern by conventional or state-of the-art lithography, such as 193 nm immersion lithography (193i) or EUV lithography, which, in some embodiments, can involve pitch division to increase the density of lines in the gridded layout by a factor of n. Gridded layout formation with 193i lithography plus pitch division by a factor of n can be designated as 193i+P/n Pitch Division. Patterning of the pitch divided gridded layout can also be achieved using conventional optical lithography. However, in an embodiment, inline editing of the circuit pattern printed using optical lithography or EUV lithography without the need for fabricating an entirely new mask can be achieved using complementary EBL to add a feature to the pattern, to remove a feature from the pattern, or to both add and remove features from the pattern.

More generally, embodiments described herein are directed to patterning features during the fabrication of an integrated circuit. For example, integrated circuits commonly include electrically conductive microelectronic structures, which are known in the art as vias. Vias can be used to electrically connect metal lines above the vias to metal lines below the vias. In one embodiment, an inline circuit edit approach is used to pattern additional openings for forming vias, or to plug select pattern openings for forming vias. In another embodiment, an inline circuit edit approach is used to form non-conductive spaces or interruptions along the metal lines, or to remove select non-conductive spaces or interruptions along the metal lines. Conventionally, such interruptions have been referred to as "cuts" since the process involved removal or cutting away of portions of the metal lines. However, in a damascene approach, the interruptions may be referred to as "plugs" which are regions along a metal line trajectory that are actually not metal at any stage of the fabrication scheme, but are rather preserved regions where metal cannot be formed. In either case, however, use of the terms cuts or plugs may be done so interchangeably. Via opening and metal line cut or plug formation is commonly referred to as back-end-of-line (BEOL) processing for an integrated circuit. In another embodiment, an inline circuit edit approach is used for front-end-of-line (FEOL) processing or backside metal processing. For example, the scaling of active region dimensions (such as fin dimensions) and/or associated gate structures can be performed using inline circuit edit techniques as described herein.

As described above, electron beam (e-beam) lithography may be implemented to complement standard lithographic techniques in order to achieve desired editing of features for integrated circuit fabrication. An electron beam lithography tool may be used to perform the e-beam lithography. In an exemplary embodiment, FIG. 5 is a cross-sectional schematic representation of an e-beam column of an electron beam lithography apparatus, in accordance with an embodiment of the present disclosure.

Figure 5:
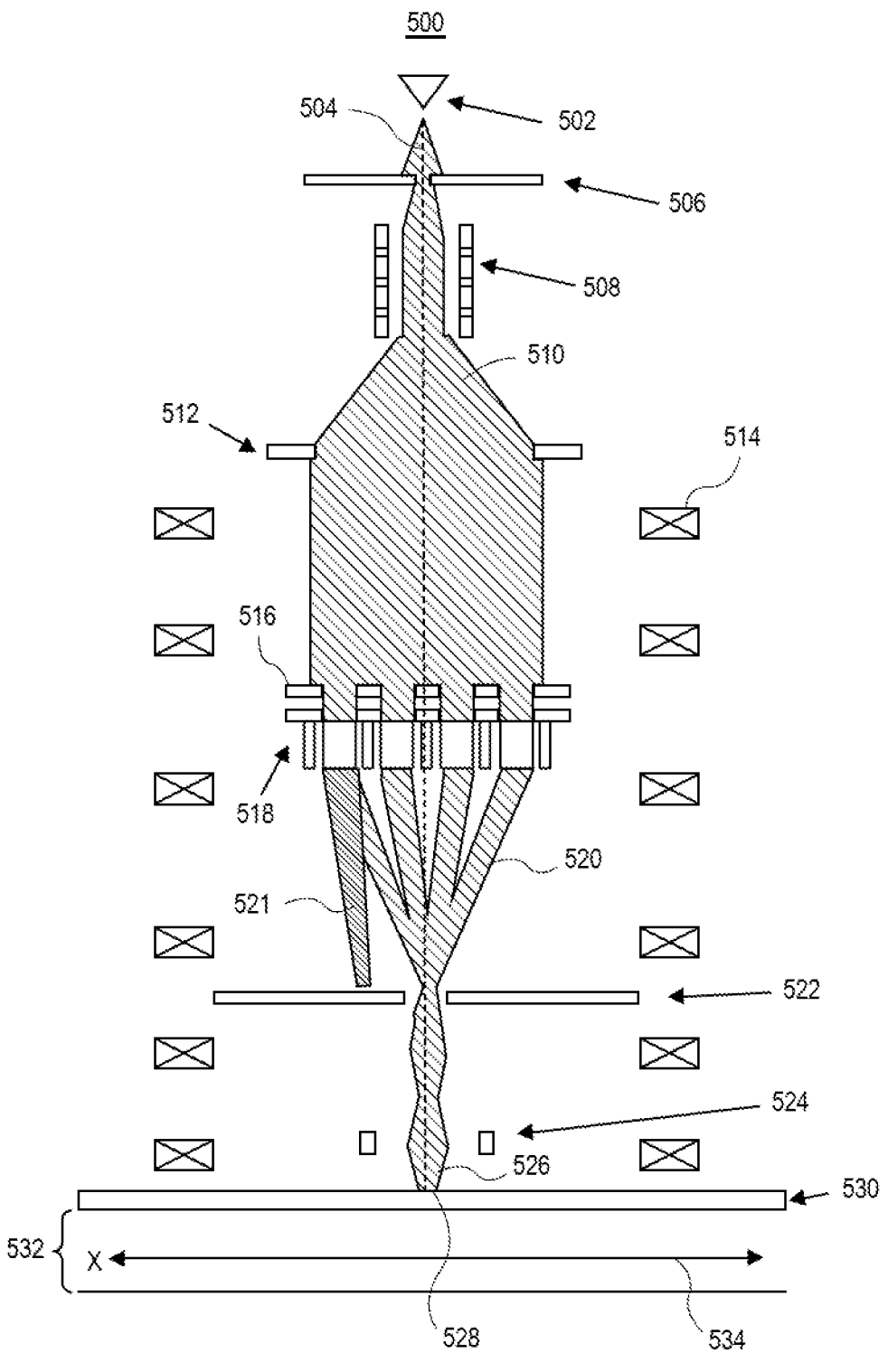
FIG. 5 is a cross-sectional schematic representation of an e-beam column of an electron beam lithography apparatus, in accordance with an embodiment of the present disclosure.

Referring to FIG. 5, an e-beam column 500 includes an electron source 502 for providing a beam of electrons 504. The beam of electrons 504 is passed through a limiting aperture 506 and, subsequently, through high aspect ratio illumination optics 508. The outgoing beam 510 is then passed through a slit 512 and may be controlled by a slim lens 514, e.g., which may be magnetic. Ultimately, the e-beam 504 is passed through a shaping aperture 516 (which may be a one-dimensional (1-D) shaping aperture) and then through a blanker aperture array (BAA) 518. The BAA 518 includes a plurality of physical apertures therein, such as openings formed in a thin slice of silicon. It may be the case that only a portion of the BAA 518 is exposed to the e-beam at a given time. Alternatively, or in conjunction, only a portion 520 of the e-beam 504 that passes through the BAA 518 is allowed to pass through a final aperture 522 (e.g., beam portion 521 is shown as blocked) and, possibly, a stage feedback deflector 524.

Referring again to FIG. 5, the resulting e-beam 526 ultimately impinges as a spot 528 on a surface of a wafer 530, such as a silicon wafer used in IC manufacture. Specifically, the resulting e-beam may impinge on a photoresist layer on the wafer, but embodiments are not so limited. A stage scan 532 moves the wafer 530 relative to the e-beam 526 along the direction of the arrow 534 shown in FIG. 5. It is to be appreciated that an e-beam tool in its entirety may include numerous columns 500 of the type depicted in FIG. 5. Also, as described in some embodiments below, the e-beam tool may have an associated base computer, and each column may further have a corresponding column computer.

In an embodiment, when referring below to openings or apertures in a blanker aperture array (BAA), all or some of the openings or apertures of the BAA can be switched open or "closed" (e.g., by beam deflecting) as the wafer/die moves underneath along a wafer travel or scan direction. In one embodiment, the BAA can be independently controlled as to whether each opening passes the e-beam through to the sample or deflects the e-beam into, e.g., a Faraday cup or blanking aperture. The e-beam column or apparatus including such a BAA may be built to deflect the overall beam coverage to just a portion of the BAA, and then individual openings in the BAA are electrically configured to pass the e-beam ("on") or not pass ("off"). For example, un-deflected electrons pass through to the wafer and expose a resist layer, while deflected electrons are caught in the Faraday cup or blanking aperture. It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut. As an example provided below in FIG. 8, the spots generated from the BAA 800 have a pitch the same as the pitch of the lines 808 (when both columns 802 and 804 of BAA openings are considered together). Meanwhile, the spots generated from only one column of the staggered array of the BAA 800 have twice the pitch as the pitch of the lines 808.

It is also to be appreciated that, in some embodiments, an e-beam column as described above may also include other features in addition to those described in association with FIG. 5. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage.

Figure 6:
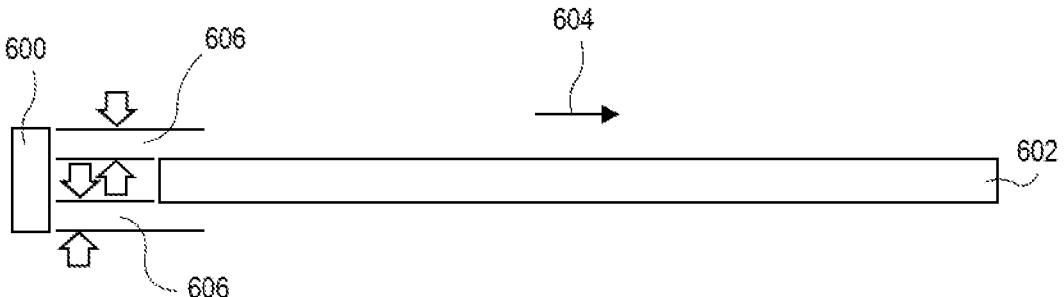
FIG. 6 illustrates an aperture (left) of a BAA relative to a line (right) to be cut or to have vias placed in targeted locations while the line is scanned under the aperture, in accordance with an embodiment of the present disclosure.

As a general exemplary embodiment to provide context for more detailed embodiments, a staggered beam aperture array is implemented to solve throughput of an e-beam machine while also enabling minimum line pitch. With no stagger, consideration of edge placement error (EPE) means that a minimum pitch that is twice the line width cannot be cut since there is no possibility of stacking vertically in a single stack. For example, FIG. 6 illustrates an aperture 600 of a BAA relative to a line 602 to be cut or to have vias placed in targeted locations while the line is scanned along the direction of the arrow 604 under the aperture 600, in accordance with an embodiment of the present disclosure. Referring to FIG. 6, for a given line 602 to be cut or vias to be placed, the EPE 606 of the cutter opening (aperture) results in a rectangular opening in the BAA grid that is the pitch of the line.

Figure 7:
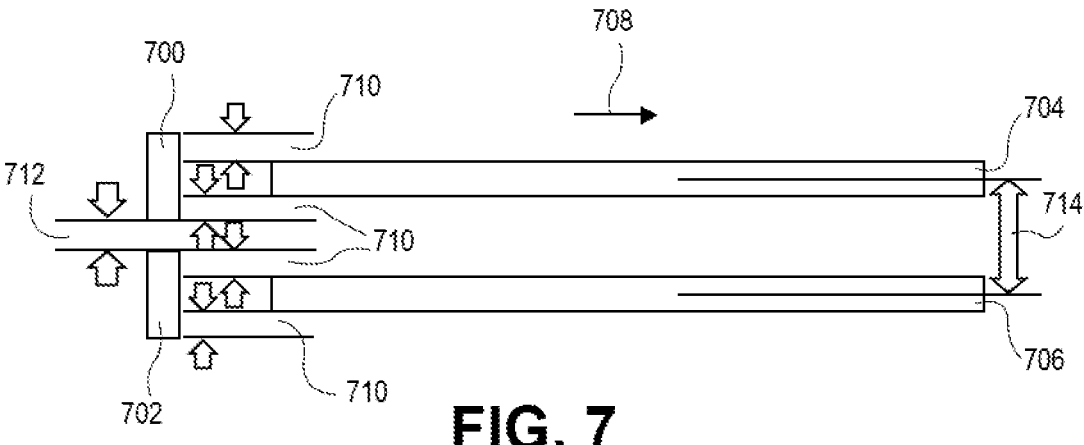
FIG. 7 illustrates two non-staggered apertures (left) of a BAA relative to two lines (right) to be cut or to have vias placed in targeted locations while the lines are scanned under the apertures, in accordance with an embodiment of the present disclosure.

FIG. 7 illustrates two non-staggered apertures 700 and 702 of a BAA relative to two lines 704 and 706, respectively, to be cut or to have vias placed in targeted locations while the lines are scanned along the direction of the arrow 708 under the apertures 700 and 702, in accordance with an embodiment of the present disclosure. Referring to FIG. 7, when the rectangular opening 600 of FIG. 6 is placed in a vertical single column with other such rectangular openings (e.g., now as 700 and 702), the allowed pitch of the lines to be cut is limited by 2*x* EPE 710 plus the distance requirement 712 between the BAA opens 700 and 702 plus the width of one line 704 or 706. The resulting spacing 714 is shown by the arrow on the far right of FIG. 7. Such a linear array would severely limit the pitch of the wiring to be substantially greater than 3-4× of the width of the lines, which may be unacceptable. Another unacceptable alternative would be to cut tighter pitch lines in two (or more) passes with slightly offset line locations. Such an approach could severely limit the throughput of the e-beam machine.

Figure 8:
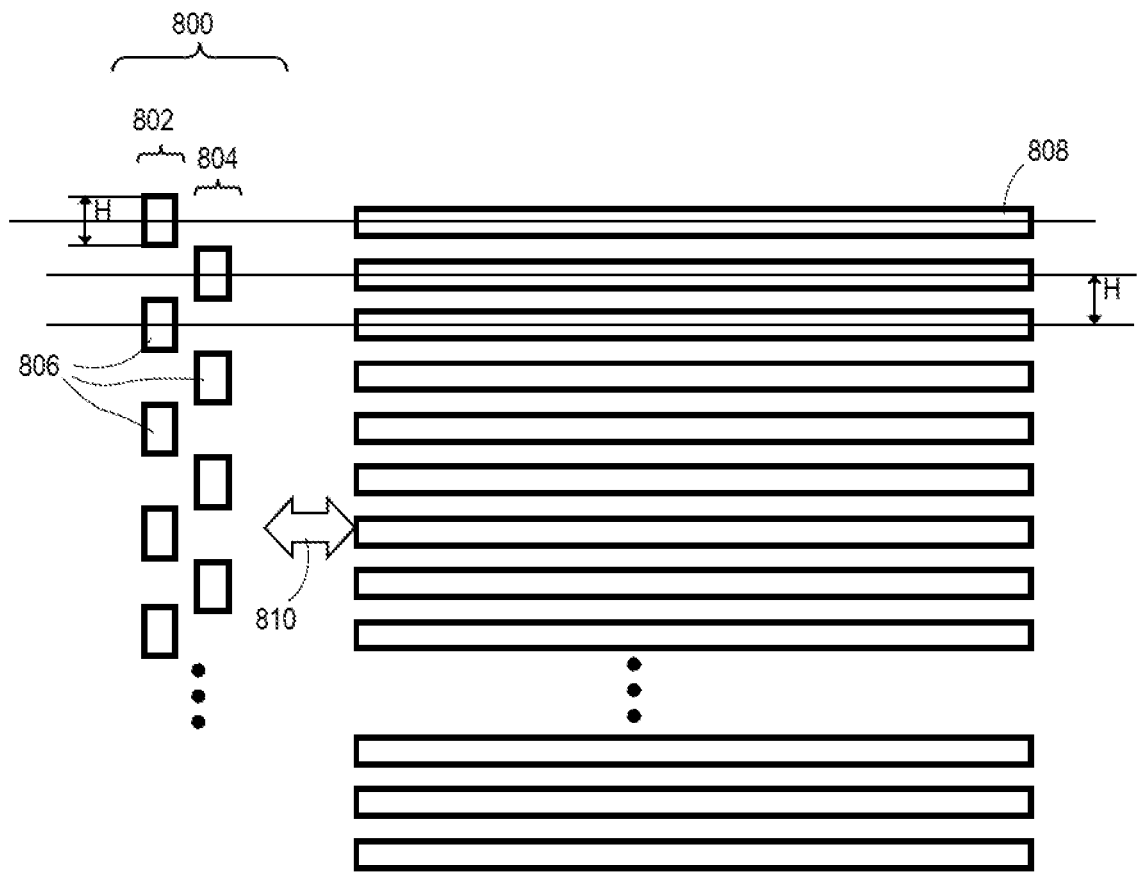
FIG. 8 illustrates two columns of staggered apertures (left) of a BAA relative to a plurality of lines (right) to be cut or to have vias placed in targeted locations while the lines are scanned under the apertures, with scanning direction shown by the arrow, in accordance with an embodiment of the present disclosure.

By contrast to FIG. 7, FIG. 8 illustrates two columns 802 and 804 of staggered apertures 806 of a BAA 800 relative to a plurality of lines 808 to be cut or to have vias placed in targeted locations while the lines 808 are scanned along the direction 810 under the apertures 806, with scanning direction shown by the arrow, in accordance with an embodiment of the present disclosure, in accordance with an embodiment of the present disclosure. Referring to FIG. 8, a staggered BAA 800 includes two linear arrays 802 and 804, staggered spatially as shown. The two staggered arrays 802 and 804 cut (or place vias at) alternate lines 808. The lines 808 are, in one embodiment, placed on a tight grid at twice the line width. As used throughout the present disclosure, the term staggered array can refer to a staggering of openings 806 that stagger in one direction (e.g., the vertical direction) and either have no overlap or have some overlap when viewed as scanning in the orthogonal direction (e.g., the horizontal direction). In the latter case, the effective overlap can provide for tolerance in misalignment.

It is to be appreciated that, although a staggered array is shown herein as two vertical columns for simplicity, the openings or apertures of a single "column" need not be columnar in the vertical direction. For example, in an embodiment, so long as a first array collectively has a pitch in the vertical direction, and a second array staggered in the scan direction from the first array collectively has the pitch in the vertical direction, the staggered array is achieved. Thus, reference to or depiction of a vertical column herein can actually be made up of one or more columns unless specified as being a single column of openings or apertures. In one embodiment, in the case that a "column" of openings is not a single column of openings, any offset within the "column" can be compensated with strobe timing. In an embodiment, the critical point is that the openings or apertures of a staggered array of a BAA lie on a specific pitch in the first direction, but are offset in the second direction to allow them to place cuts or vias without any gap between cuts or vias in the first direction.

Thus, one or more embodiments are directed to a staggered beam aperture array where openings are staggered to allow meeting EPE cuts and/or via requirements as opposed to an inline arrangement that cannot accommodate for EPE technology needs. By contrast, with no stagger, the problem of edge placement error (EPE) means that a minimum pitch that is twice the line width cannot be cut since there is no possibility of stacking vertically in single stack. Instead, in an embodiment, use of a staggered BAA enables much greater than 4000 times faster than individually e-beam writing each line location. Furthermore, a staggered array allows a line pitch to be twice the line width. In a particular embodiment, an array has 4096 staggered openings over two columns such that EPE for each of the cut and via locations can be made. It is to be appreciated that a staggered array, as contemplated herein, may include two or more columns of staggered openings.

In an embodiment, use of a staggered array leaves space for including metal around the apertures of the BAA which contain one or two electrodes for passing or steering the e-beam to the wafer or steering to a Faraday cup or blanking aperture. That is, each opening may be separately controlled by electrodes to pass or deflect the e-beam. In one embodiment, the BAA has 4096 openings, and the e-beam apparatus covers the entire array of 4096 openings, with each opening electrically controlled. Throughput improvements are enabled by sweeping the wafer under the opening as shown by the thick black arrows.

Figure 9:
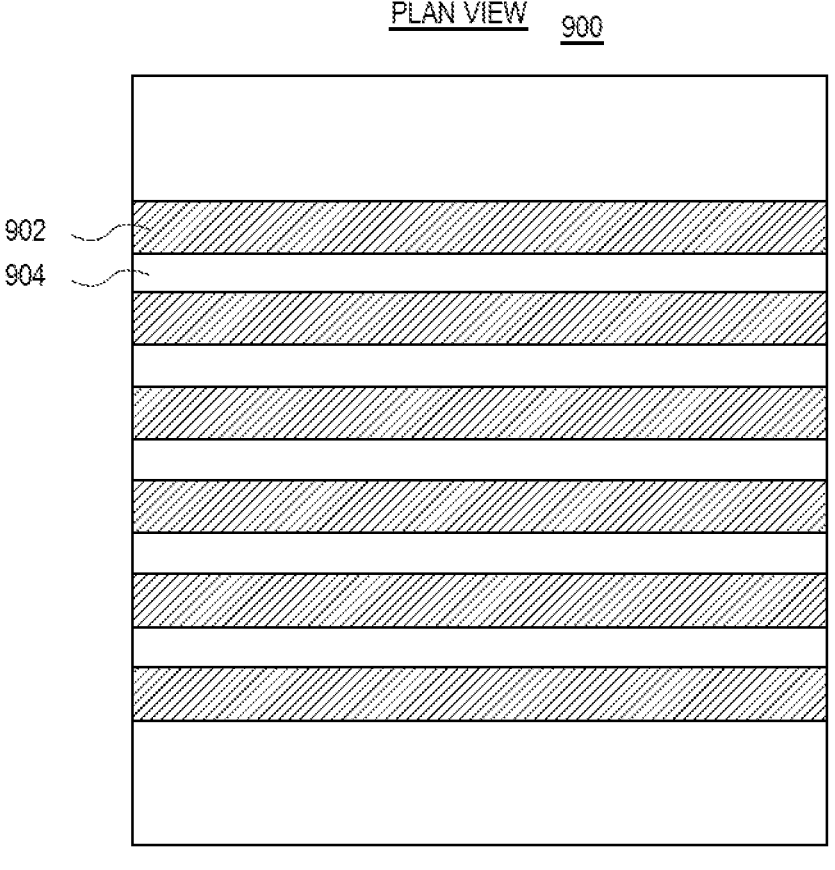
FIG. 9 illustrates a plan view and corresponding cross-sectional view of a previous layer metallization structure, in accordance with an embodiment of the present disclosure.
Figure 9:
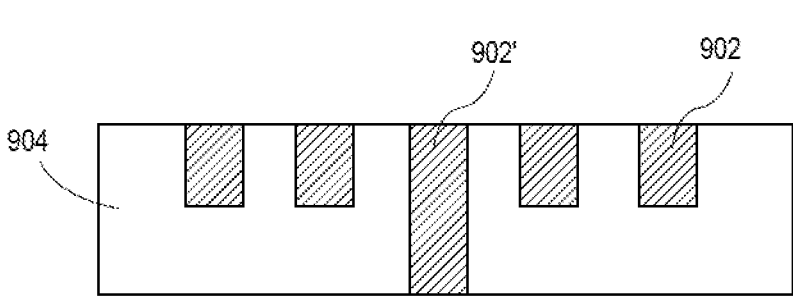

More generally, it is to be appreciated that a metallization layer having lines with line cuts (or plugs) and having associated vias may be fabricated above a substrate and, in one embodiment, may be fabricated above a previous metallization layer. As an example, FIG. 9 illustrates a plan view and corresponding cross-sectional view of a previous layer metallization structure, in accordance with an embodiment of the present disclosure. Referring to FIG. 9, a starting structure 900 includes a pattern of metal lines 902 and interlayer dielectric (ILD) lines 904. The starting structure 900 may be patterned in a grating-like pattern with metal lines spaced at a constant pitch and having a constant width, as is depicted in FIG. 9. Although not shown, the lines 902 may have interruptions (i.e., cuts or plugs) at various locations along the lines. The pattern, for example, may be fabricated by a pitch halving or pitch quartering approach, as described above. Some of the lines may be associated with underlying vias, such as line 902' shown as an example in the cross-sectional view.

In an embodiment, fabrication of a metallization layer on the previous metallization structure of FIG. 9 begins with formation of an interlayer dielectric (ILD) material above the structure 900. A hardmask material layer may then be formed on the ILD layer. The hardmask material layer may be patterned to form a grating of unidirectional lines orthogonal to the lines 902 of 900. In one embodiment, the grating of unidirectional hardmask lines is fabricated using conventional lithography (e.g., photoresist and other associated layers) and may have a line density defined by a pitch-halving, pitch-quartering etc. approach as described above. The grating of hardmask lines leaves exposed a grating region of the underlying ILD layer. It is these exposed portions of the ILD layer that are ultimately patterned for metal line formation, via formation, and plug formation. For example, in an embodiment, via locations are patterned in regions of the exposed ILD using EBL as described above. The patterning may involve formation of a resist layer and patterning of the resist layer by EBL to provide via opening locations which may be etched into the ILD regions. The lines of overlying hardmask can be used to confine the vias to only regions of the exposed ILD, with overlap accommodated by the hardmask lines which can effectively be used as an etch stop. Plug (or cut) locations may also be patterned in exposed regions of the ILD, as confined by the overlying hardmask lines, in a separate EBL processing operation. The fabrication of cuts or plugs effectively preserve regions of ILD that will ultimately interrupt metal lines fabricated therein. Metal lines may then be fabricated using a damascene approach, where exposed portions of the ILD (those portions between the hardmask lines and not protected by a plug preservation layer, such as a resist layer patterned during "cutting") are partially recessed. The recessing may further extend the via locations to open metal lines from the underlying metallization structure. The partially recessed ILD regions are then filled with metal (a process which may also involve filling the via locations), e.g., by plating and CMP processing, to provide metal lines between the overlying hardmask lines. The hardmask lines may ultimately be removed for completion of a metallization structure. It is to be appreciated that the above ordering of line cuts, via formation, and ultimate line formation is provided only as an example. A variety of processing schemes may be accommodated using EBL cuts and vias, as described herein.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be appreciated that the layers and materials described in association with FIG. 9 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 9 may be fabricated on underlying lower level interconnect layers.

In another embodiment, EBL inline edits may be used to fabricate semiconductor devices, such as PMOS or NMOS devices of an integrated circuit. In one such embodiment, EBL inline edits are used to pattern a grating of active regions that are ultimately used to form fin-based or trigate or nanowire or nanoribbon or nanosheet structures. In another such embodiment, EBL inline edits are used to pattern a gate layer, such as a poly layer, ultimately used for gate electrode fabrication. As an example of a completed device, FIGS. 10A and 10B illustrate a cross-sectional view and a plan view (taken along the a-a' axis of the cross-sectional view), respectively, of a non-planar semiconductor device having a plurality of fins, in accordance with an embodiment of the present disclosure.

Figure 10A:
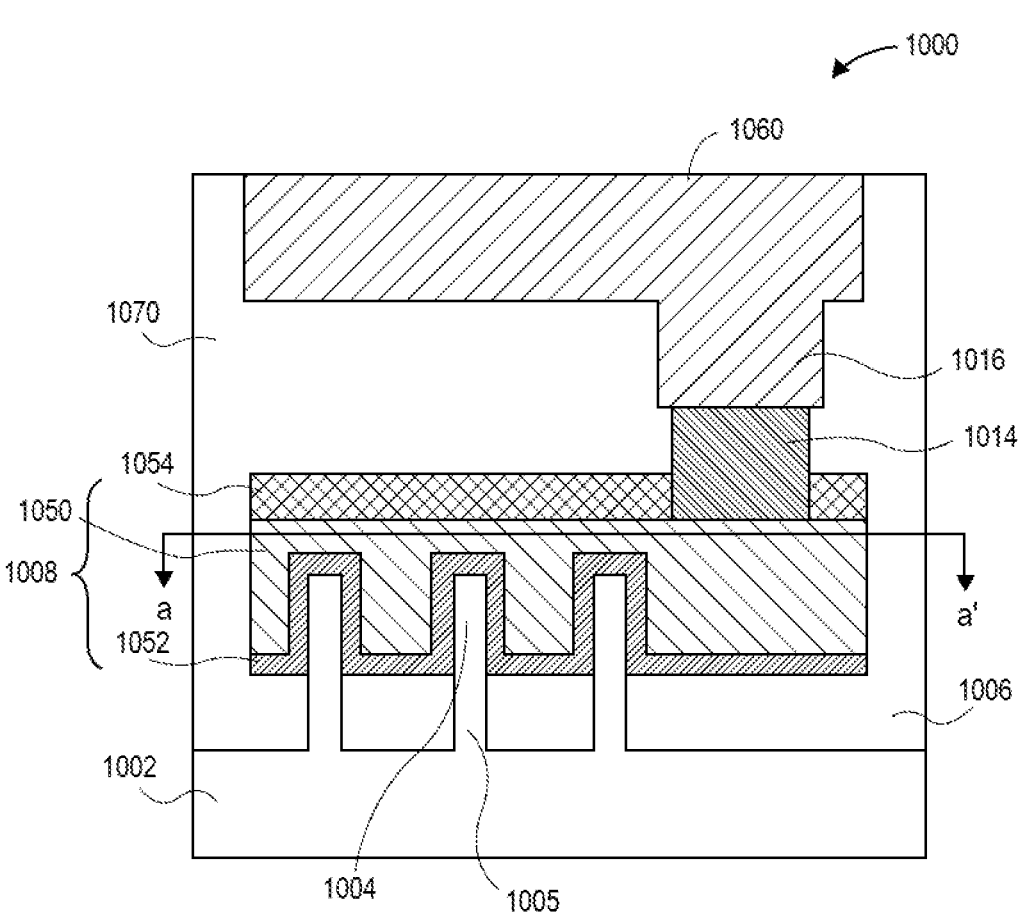
FIG. 10A illustrates a cross-sectional view of a non-planar semiconductor device having fins, in accordance with an embodiment of the present disclosure.

Referring to FIG. 10A, a semiconductor structure or device 1000 includes a non-planar active region (e.g., a fin structure including protruding fin portion 1004 and sub-fin region 1005) formed from substrate 1002, and within isolation region 1006. A gate line 1008 is disposed over the protruding portions 1004 of the non-planar active region as well as over a portion of the isolation region 1006. As shown, gate line 1008 includes a gate electrode 1050 and a gate dielectric layer 1052. In one embodiment, gate line 1008 may also include a dielectric cap layer 1054. A gate contact 1014, and overlying gate contact via 1016 are also seen from this perspective, along with an overlying metal interconnect 1060, all of which are disposed in inter-layer dielectric stacks or layers 1070. Also seen from the perspective of FIG. 10A, the gate contact 1014 is, in one embodiment, disposed over isolation region 1006, but not over the non-planar active regions.

Figure 10B:
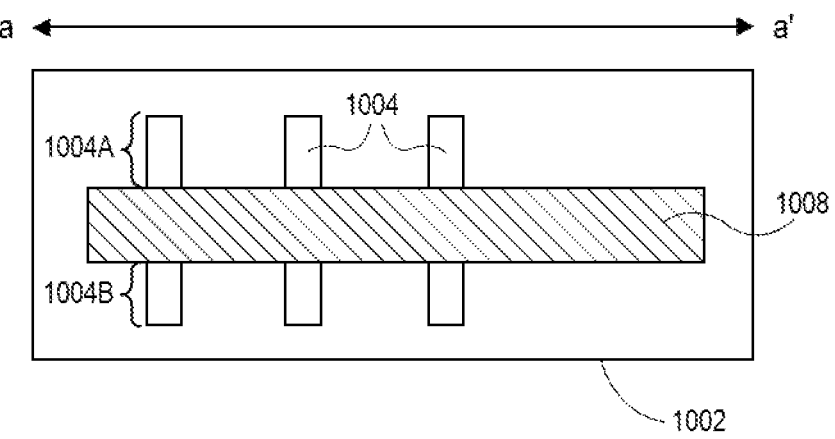
FIG. 10B illustrates a plan view taken along the a-a' axis of the semiconductor device of FIG. 10A, in accordance with an embodiment of the present disclosure.

Referring to FIG. 10B, the gate line 1008 is shown as disposed over the protruding fin portions 1004. Source and drain regions 1004A and 1004B of the protruding fin portions 1004 can be seen from this perspective. In one embodiment, the source and drain regions 1004A and 1004B are doped portions of original material of the protruding fin portions 1004. In another embodiment, the material of the protruding fin portions 1004 is removed and replaced with another semiconductor material, e.g., by epitaxial deposition. In either case, the source and drain regions 1004A and 1004B may extend below the height of dielectric layer 1006, i.e., into the sub-fin region 1005.

In an embodiment, the semiconductor structure or device 1000 is a non-planar device such as, but not limited to, a fin-FET or a tri-gate or a nanowire or a nanoribbon or a nanosheet device. In such an embodiment, a corresponding semiconducting channel region is composed of or is formed in a three-dimensional body. In one such embodiment, the gate electrode stacks of gate lines 1008 surround at least a top surface and a pair of sidewalls of the three-dimensional body.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
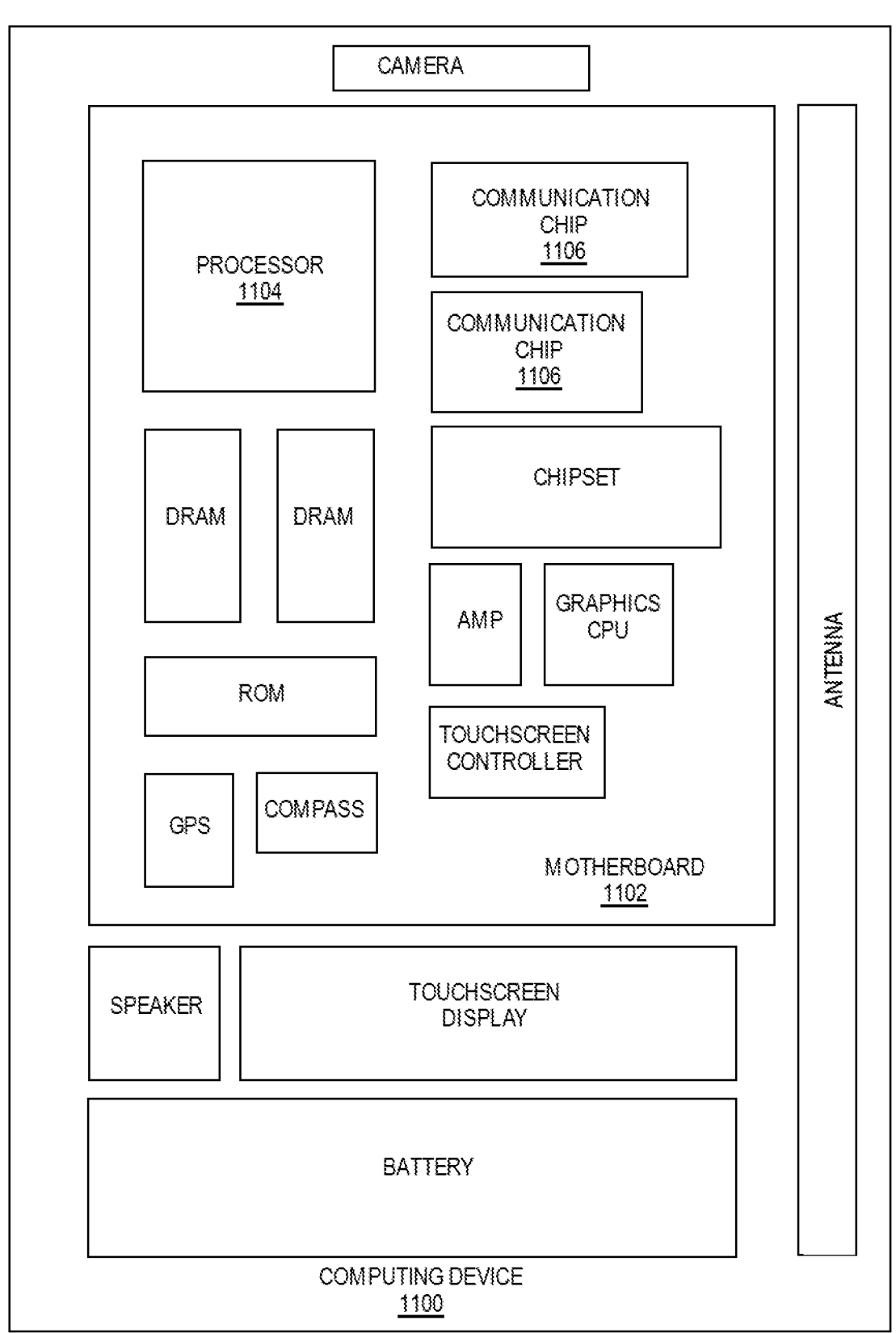
FIG. 11 illustrates a computing device in accordance with one implementation of the disclosure.

FIG. 11 illustrates a computing device 1100 in accordance with one implementation of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of the disclosure, the integrated circuit die of the processor includes one or more structures fabricated using an inline circuit edit approach, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1106 also includes an integrated circuit die packaged within the communication chip 1106. In accordance with another implementation of embodiments of the disclosure, the integrated circuit die of the communication chip includes one or more structures fabricated using an inline circuit edit approach, in accordance with implementations of embodiments of the disclosure.

In further implementations, another component housed within the computing device 1100 may contain an integrated circuit die that includes one or more structures fabricated using an inline circuit edit approach, in accordance with implementations of embodiments of the disclosure.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with an e-beam tool such as described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 12:
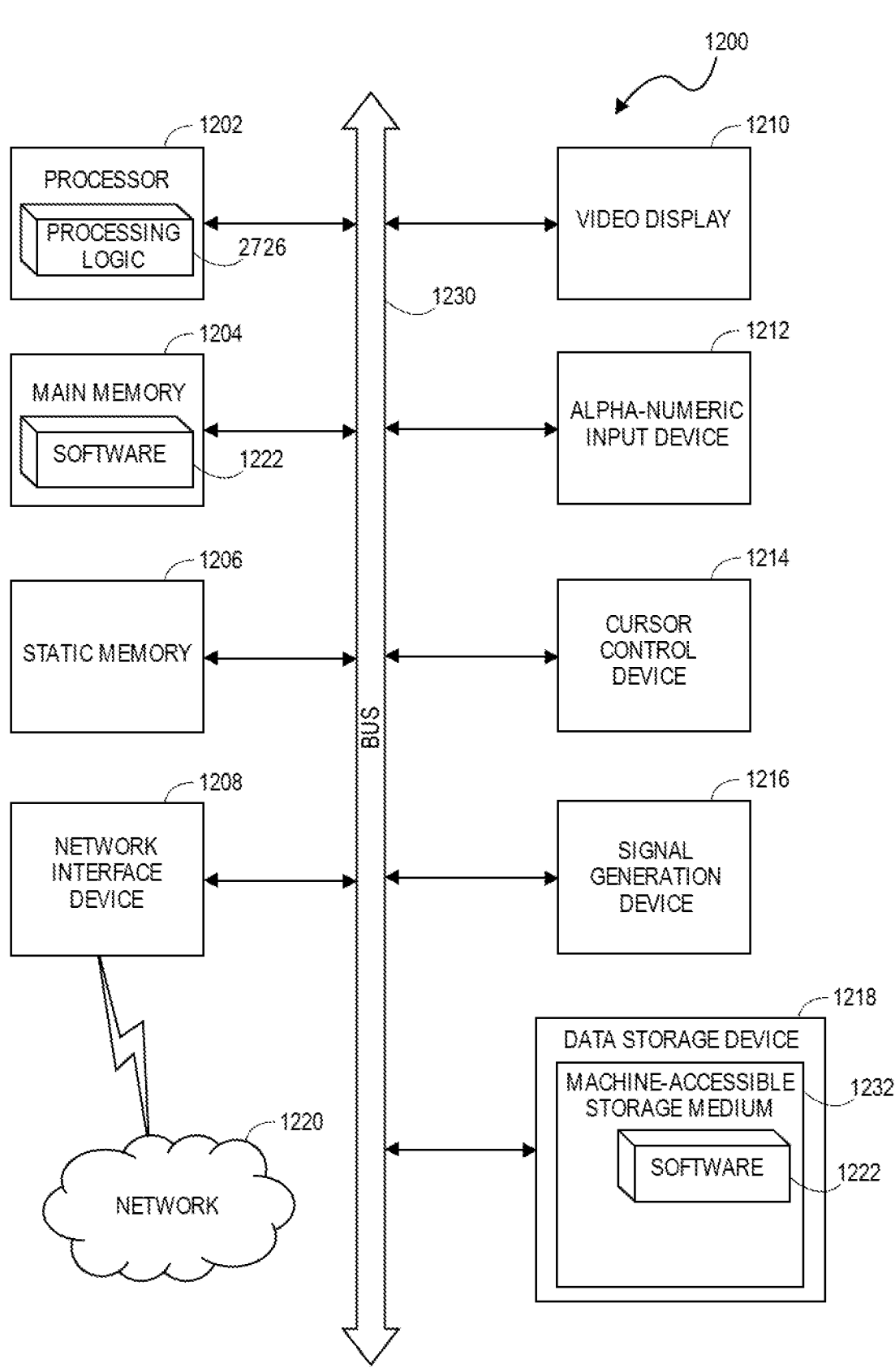
FIG. 12 illustrates a block diagram of an exemplary computer system, in accordance with an embodiment of the present disclosure.

FIG. 12 illustrates a diagrammatic representation of a machine in the exemplary form of a computer system 1200 within which a set of instructions, for causing the machine to perform any one or more of the methodologies described herein (such as end-point detection), may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations described herein.

The computer system 1200 may further include a network interface device 1208. The computer system 1200 also may include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1232 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1232 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

Implementations of embodiments of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 13:
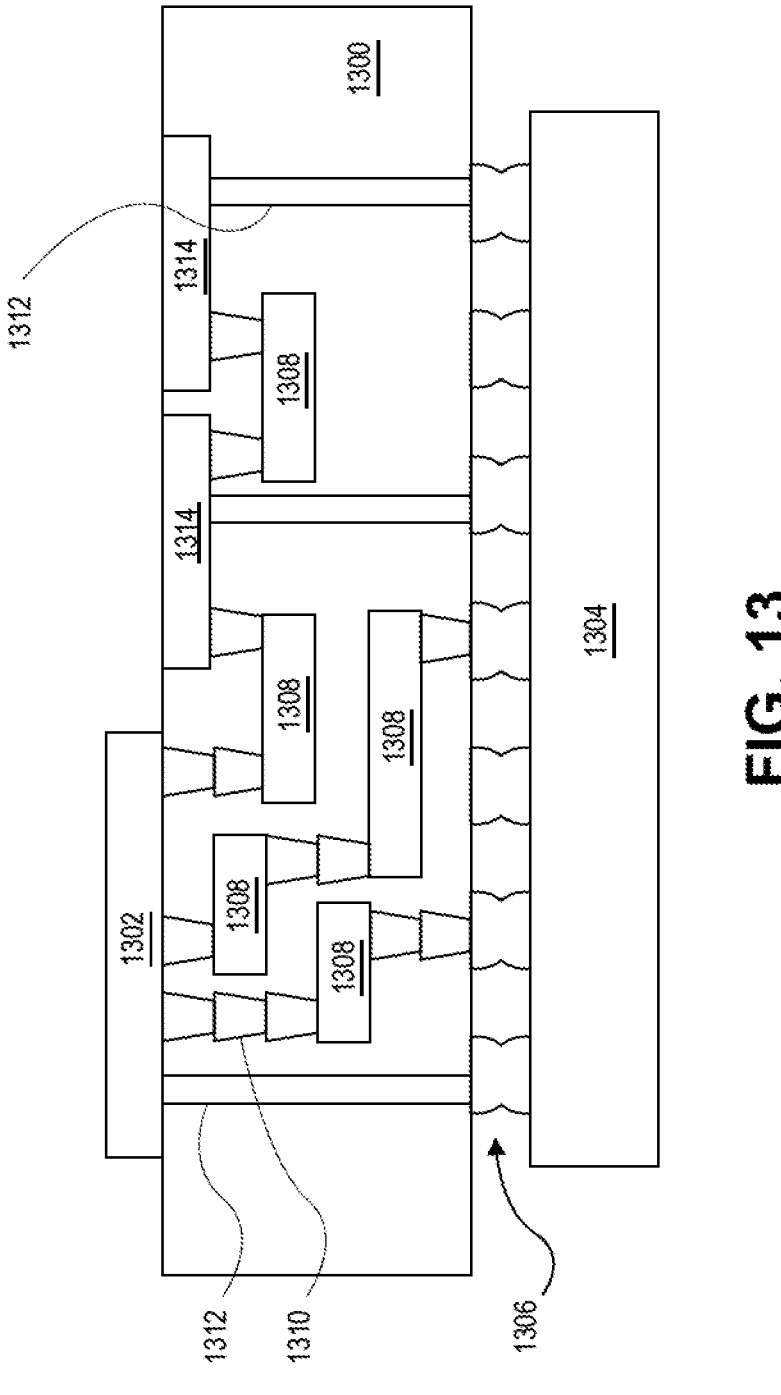
FIG. 13 is an interposer implementing one or more embodiments of the disclosure.

FIG. 13 illustrates an interposer 1300 that includes one or more embodiments of the disclosure. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer 1300 may be formed of alternate rigid or flexible materials that may include the same materials described above for use in a semiconductor substrate, such as silicon, germanium, and other group III-V and group IV materials.

The interposer 1300 may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300.

In accordance with embodiments of the disclosure, apparatuses or processes disclosed herein may be used in the fabrication of interposer 1300.

Figure 14:
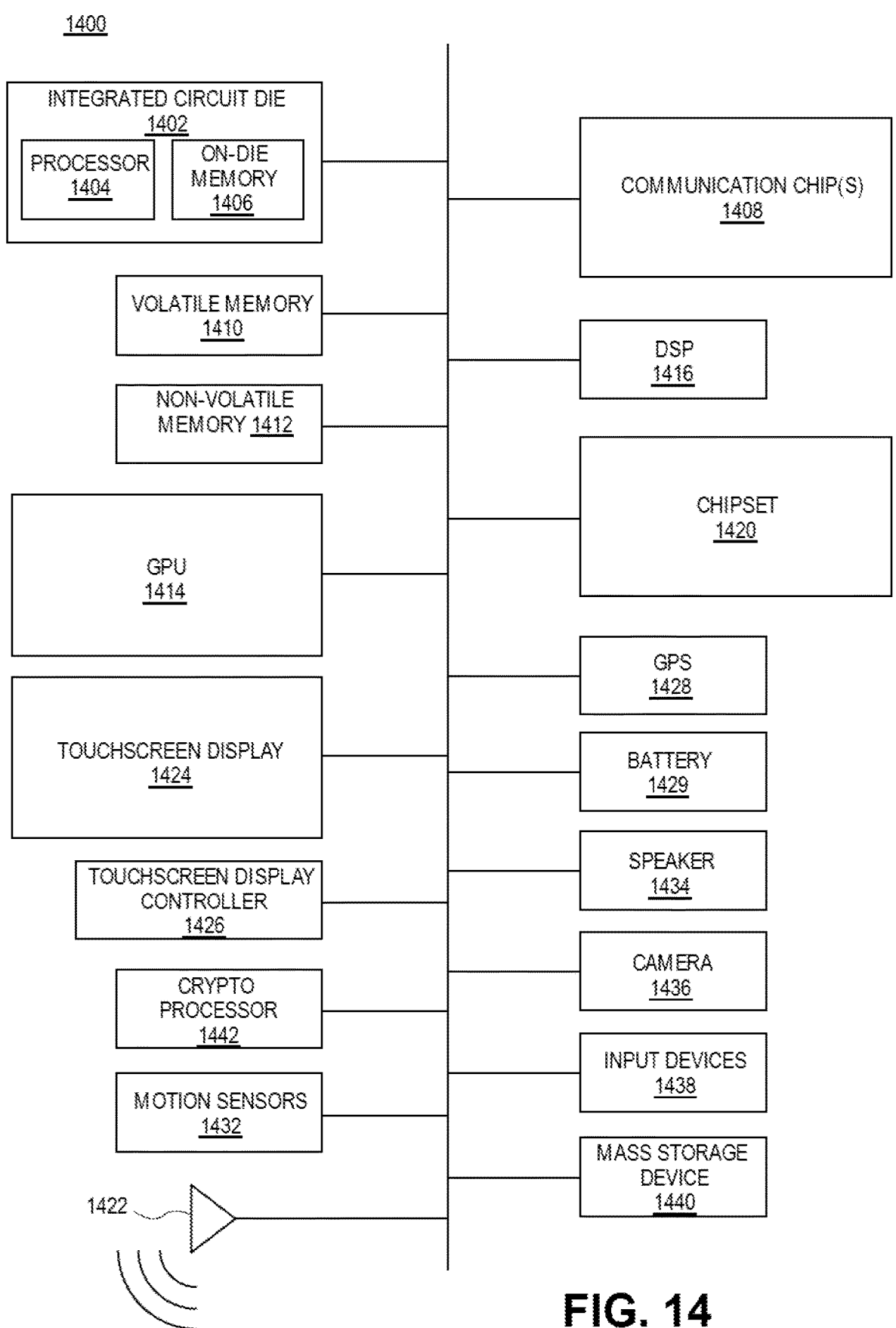
FIG. 14 is a computing device built in accordance with an embodiment of the disclosure.

FIG. 14 illustrates a computing device 1400 in accordance with one embodiment of the disclosure. The computing device 1400 may include a number of components. In one embodiment, these components are attached to one or more motherboards. In an alternate embodiment, these components are fabricated onto a single system-on-a-chip (SoC) die rather than a motherboard. The components in the computing device 1400 include, but are not limited to, an integrated circuit die 1402 and at least one communication chip 1408. In some implementations the communication chip 1408 is fabricated as part of the integrated circuit die 1402. The integrated circuit die 1402 may include a CPU 1404 as well as on-die memory 1406, often used as cache memory, that can be provided by technologies such as embedded DRAM (eDRAM) or spin-transfer torque memory (STTM or STTM-RAM).

Computing device 1400 may include other components that may or may not be physically and electrically coupled to the motherboard or fabricated within an SoC die. These other components include, but are not limited to, volatile memory 1410 (e.g., DRAM), non-volatile memory 1412 (e.g., ROM or flash memory), a graphics processing unit 1414 (GPU), a digital signal processor 1416, a crypto processor 1442 (a specialized processor that executes cryptographic algorithms within hardware), a chipset 1420, an antenna 1422, a display or a touchscreen display 1424, a touchscreen controller 1426, a battery 1429 or other power source, a power amplifier (not shown), a global positioning system (GPS) device 1428, a compass 1430, a motion coprocessor or sensors 1432 (that may include an accelerometer, a gyroscope, and a compass), a speaker 1434, a camera 1436, user input devices 1438 (such as a keyboard, mouse, stylus, and touchpad), and a mass storage device 1440 (such as hard disk drive, compact disk (CD), digital versatile disk (DVD), and so forth).

The communications chip 1408 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1408. For instance, a first communication chip 1408 may be dedicated to shorter range wireless communications such as Wi-Fi and Bluetooth and a second communication chip 1408 may be dedicated to longer range wireless communications such as GPS, EDGE, GPRS, CDMA, WiMAX, LTE, Ev-DO, and others.

The processor 1404 of the computing device 1400 includes one or more structures fabricated using an inline circuit edit approach, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1408 may also include one or more structures fabricated using an inline circuit edit approach, in accordance with implementations of embodiments of the disclosure.

In further embodiments, another component housed within the computing device 1400 may contain one or more structures fabricated using an inline circuit edit approach, in accordance with implementations of embodiments of the disclosure.

In various embodiments, the computing device 1400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Thus, lithographic methodologies involving, and apparatuses suitable for, inline circuit edits have been disclosed.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a device layer including a plurality of transistor structures. A front-end routing layer is above the device layer, the front-end routing layer coupled to one or more of the plurality of transistors. A backside metal structure is below the device layer. A conductive feedthrough structure is directly coupling the backside metal structure to the front-end routing layer. The conductive feedthrough structure is a monolithic structure extending through the device layer.

Example embodiment 2: The integrated circuit structure of example embodiment 1, further including a second backside metal structure coupled to one of the plurality of transistors by a backside contact structure, the second backside metal structure laterally adjacent to the backside metal structure.

Example embodiment 3: The integrated circuit structure of example embodiment 1 or 2, further including a backside routing layer below the backside metal structure.

Example embodiment 4: The integrated circuit structure of example embodiment 1, 2 or 3, wherein individual ones of the plurality of transistors include a plurality of nanowires.

Example embodiment 5: The integrated circuit structure of example embodiment 1, 2, 3 or 4, wherein the conductive feedthrough structure delivers power from the backside metal structure to the front-end routing layer.

Example embodiment 6: The integrated circuit structure of example embodiment 1, 2, 3, 4 or 5, wherein the conductive feedthrough structure is fabricated by an inline circuit edit process.

Example embodiment 7: A method of fabricating an integrated circuit structure includes forming a device layer including a plurality of transistor structures. The method also includes forming a front-end routing layer above the device layer, the front-end routing layer coupled to one or more of the plurality of transistors. The method also includes forming a conductive feedthrough structure using a maskless lithography process, the conductive feedthrough structure coupled to the front-end routing layer. The method also includes forming a backside contact structure using a masked lithography process, the backside contact structure coupled to one of the plurality of transistors.

Example embodiment 8: The integrated circuit structure of example embodiment 7, further including forming a first backside metal structure below the device layer, wherein the conductive feedthrough structure directly couples the first backside metal structure to the front-end routing layer, and forming a second backside metal structure below the device layer and laterally spaced apart from the first backside metal structure, the second backside metal structure coupled to the backside contact structure.

Example embodiment 9: The integrated circuit structure of example embodiment 7 or 8, wherein the maskless lithography process is an e-beam process.

Example embodiment 10: The integrated circuit structure of example embodiment 7, 8 or 9, wherein the masked lithography process is an extreme ultraviolet (EUV) process.

Example embodiment 11: A computing device includes a board, and a component coupled to the board. The component includes an integrated circuit structure including a device layer including a plurality of transistor structures. A front-end routing layer is above the device layer, the front-end routing layer coupled to one or more of the plurality of transistors. A backside metal structure is below the device layer. A conductive feedthrough structure is directly coupling the backside metal structure to the front-end routing layer. The conductive feedthrough structure is a monolithic structure extending through the device layer.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, wherein the component is a packaged integrated circuit die.

Example embodiment 15: The computing device of example embodiment 11, 12, 13 or 14, wherein the component is selected from the group consisting of a processor, a communications chip, and a digital signal processor.

Example embodiment 16: A computing device includes a board, and a component coupled to the board. The component includes an integrated circuit structure. The integrated circuit structure is fabricated according to a method including forming a device layer including a plurality of transistor structures. The method also includes forming a front-end routing layer above the device layer, the front-end routing layer coupled to one or more of the plurality of transistors. The method also includes forming a conductive feedthrough structure using a maskless lithography process, the conductive feedthrough structure coupled to the front-end routing layer. The method also includes forming a backside contact structure using a masked lithography process, the backside contact structure coupled to one of the plurality of transistors.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, wherein the component is a packaged integrated circuit die.

Example embodiment 20: The computing device of example embodiment 16, 17, 18 or 19, wherein the component is selected from the group consisting of a processor, a communications chip, and a digital signal processor.

What is claimed is:

1. An integrated circuit structure, comprising:
   a device layer comprising a plurality of transistor structures;
   a front-end routing layer above the device layer, the front-end routing layer coupled to one or more of the plurality of transistors;
   a first backside metal structure below the device layer;
   a conductive feedthrough structure directly coupling the first backside metal structure to the front-end routing layer, wherein the conductive feedthrough structure is a monolithic structure extending through the device layer;
   a second backside metal structure coupled to one of the plurality of transistors by a backside contact structure, the second backside metal structure laterally adjacent to the first backside metal structure; and
   a backside routing layer below the first backside metal structure and the second backside metal structure, the backside routing layer coupling the first backside metal structure to the second backside metal structure.

2. The integrated circuit structure of claim 1, wherein individual ones of the plurality of transistors include a plurality of nanowires.

3. The integrated circuit structure of claim 1, wherein the conductive feedthrough structure delivers power from the first backside metal structure to the front-end routing layer.

4. The integrated circuit structure of claim 1, wherein the conductive feedthrough structure is fabricated by an inline circuit edit process.

5. A method of fabricating an integrated circuit structure, the method comprising:
   forming a device layer comprising a plurality of transistor structures;
   forming a front-end routing layer above the device layer, the front-end routing layer coupled to one or more of the plurality of transistors;
   forming a conductive feedthrough structure using a maskless lithography process, the conductive feedthrough structure coupled to the front-end routing layer;
   forming a backside contact structure using a masked lithography process, the backside contact structure coupled to one of the plurality of transistors;
   forming a first backside metal structure below the device layer, wherein the conductive feedthrough structure directly couples the first backside metal structure to the front-end routing layer, and forming a second backside metal structure below the device layer and laterally spaced apart from the first backside metal structure, the second backside metal structure coupled to the backside contact structure; and
   forming a backside routing layer below the first backside metal structure and the second backside metal structure, the backside routing layer coupling the first backside metal structure to the second backside metal structure.

6. The method of claim 5, wherein the maskless lithography process is an e-beam process.

7. The method of claim 5, wherein the masked lithography process is an extreme ultraviolet (EUV) process.

8. A computing device, comprising:
   a board; and
   a component coupled to the board, the component including an integrated circuit structure, comprising:
      a device layer comprising a plurality of transistor structures;
      a front-end routing layer above the device layer, the front-end routing layer coupled to one or more of the plurality of transistors;
      a first backside metal structure below the device layer;
      a conductive feedthrough structure directly coupling the first backside metal structure to the front-end routing layer, wherein the conductive feedthrough structure is a monolithic structure extending through the device layer;
      a second backside metal structure coupled to one of the plurality of transistors by a backside contact structure, the second backside metal structure laterally adjacent to the first backside metal structure; and
      a backside routing layer below the first backside metal structure and the second backside metal structure, the backside routing layer coupling the first backside metal structure to the second backside metal structure.

9. The computing device of claim 8, further comprising:
   a memory coupled to the board.

10. The computing device of claim 8, further comprising:

a communication chip coupled to the board.

11. The computing device of claim 8, wherein the component is a packaged integrated circuit die.

12. The computing device of claim 8, wherein the component is selected from the group consisting of a processor, a communications chip, and a digital signal processor.

13. A computing device, comprising:

a board; and a component coupled to the board, the component including an integrated circuit structure, the integrated circuit structure fabricated according to a method comprising:

forming a device layer comprising a plurality of transistor structures;

forming a front-end routing layer above the device layer, the front-end routing layer coupled to one or more of the plurality of transistors;

forming a conductive feedthrough structure using a maskless lithography process, the conductive feedthrough structure coupled to the front-end routing layer;

forming a backside contact structure using a masked lithography process, the backside contact structure coupled to one of the plurality of transistors;

forming a first backside metal structure below the device layer, wherein the conductive feedthrough structure directly couples the first backside metal structure to the front-end routing layer, and forming a second backside metal structure below the device layer and laterally spaced apart from the first backside metal structure, the second backside metal structure coupled to the backside contact structure; and forming a backside routing layer below the first backside metal structure and the second backside metal structure, the backside routing layer coupling the first backside metal structure to the second backside metal structure.

14. The computing device of claim 13, further comprising:

a memory coupled to the board.

15. The computing device of claim 13, further comprising:

a communication chip coupled to the board.

16. The computing device of claim 13, wherein the component is a packaged integrated circuit die.

17. The computing device of claim 13, wherein the component is selected from the group consisting of a processor, a communications chip, and a digital signal processor.

*     *     *     *     *